United States Patent [19]

Lorenze, Jr. et al.

[11] 4,188,709
[45] Feb. 19, 1980

[54] DOUBLE SIDED HYBRID MOSAIC FOCAL PLANE

[75] Inventors: Robert V. Lorenze, Jr., Westford; William J. White, Chelmsford, both of Mass.

[73] Assignee: Honeywell Inc., Minneapolis, Minn.

[21] Appl. No.: 916,035

[22] Filed: Jun. 16, 1978

Related U.S. Application Data

[62] Division of Ser. No. 766,327, Feb. 10, 1977, Pat. No. 4,104,674.

[51] Int. Cl.$^2$ .............................................. B01J 17/00
[52] U.S. Cl. .................................. 29/577 R; 29/580; 29/584
[58] Field of Search ........................ 29/577, 580, 584

[56] References Cited

U.S. PATENT DOCUMENTS

| | | | |
|---|---|---|---|
| 3,648,131 | 3/1972 | Stuby | 357/30 |
| 3,883,437 | 5/1975 | Nummedal | 357/30 |
| 3,982,268 | 9/1976 | Anthony | 357/55 |
| 4,013,533 | 3/1977 | Solal | 357/30 |
| 4,079,507 | 3/1978 | King | 29/580 |
| 4,144,516 | 3/1979 | Aine | 29/580 |

OTHER PUBLICATIONS

Applied Physics Letters, vol. 18, No. 8, Apr. 15, 1971, Foyt, p. 321.

Primary Examiner—W. C. Tupman
Attorney, Agent, or Firm—Charles L. Rubow

[57] ABSTRACT

A double-sided mosaic focal plane for infrared detection includes a semiconductor substrate having first and second opposing surfaces. Infrared detectors are mounted on the first surface and solid state signal processing circuitry is formed in the semiconductor substrate proximate the second surface. Interconnect means extend through the semiconductor substrate to interconnect the infrared detectors with the solid state signal processing circuitry.

2 Claims, 2 Drawing Figures

DOUBLE SIDED HYBRID MOSAIC FOCAL PLANE

This is a division of application Ser. No. 766,327, filed Feb. 10, 1977, now U.S. Pat. No. 4,104,674.

BACKGROUND OF THE INVENTION

The present invention relates to infrared sensor systems. In particular, the present invention relates to hybrid infrared system focal planes.

Previous designs of cryogenically cooled infrared focal planes can be characterized by a limited number of photodetector elements, an absence of preamplifiers or other signal processing elements, and a large complement of signal leads. Preamplification and other signal processing is carried out external to the Dewar. The complexity of the focal planes has been limited by the number of signal leads which can be routed from inside the Dewar, through vacuum seals, to the associated electronics outside of the Dewar.

Recent developments in semiconductor technology have led to the feasibility of more complex infrared system focal planes, with more sensitivity, higher resolution, higher data rate and greater reliability. These developments include advances in microelectronics, especially in charge transfer devices, MOS technology, and large scale integration.

The advent of charge transfer devices and their supporting technology introduces several major benefits. First, it is now possible to consider carrying out a variety of signal processing tasks in situ on or near the focal plane. Second, the multiplexing capability of charge transfer devices permits a dramatic reduction in the number of leads leaving the focal plane.

The integration of infrared detector and signal processors on the focal plane, therefore, reduces the number of electrical feedthroughs and decreases the system complexity. Higher system performance becomes possible, along with considerable reduction in overall cost.

The development of hybrid focal planes containing both infrared detectors and associated signal processing, however, presents several technical challenges. First, the typical infrared detector materials are mercury cadmium telluride, lead tin telluride, lead selenide telluride, and indium antimonide. The signal processing portions of the hybrid focal plane, however, will typically be silicon because the silicon technology is far more advanced than those of the typical infrared detector materials. In addition, the larger bandgap of silicon provides certain advantages over the narrower bandgaps of the typical infrared detector materials. The design of a hybrid focal plane, therefore, must accommodate infrared detectors and signal processors which are formed from different semiconductor materials.

Second, it is highly desirable to provide very high packing density of photodetectors on the focal plane. This complicates the interconnections of the photodetectors to the associated signal processing circuitry.

Third, since the photodetectors and the signal processing circuitry will be processed at different times, it is important that the processing of the infrared detectors does not adversely affect previously formed solid state signal processing circuitry, or vice versa.

SUMMARY OF THE INVENTION

The present invention is an infrared detector system which is used as a hybrid focal plane. A semiconductor substrate has infrared detectors mounted on a first surface and solid state signal processing circuitry formed in the semiconductor substrate proximate to a second surface. Interconnect means extend through the semiconductor substrate to interconnect the infrared detectors with the solid state signal processing circuitry. This configuration is compatible with different materials for the semiconductor substrate and infrared detector, allows for very high packing densities, and protects the signal processing circuitry from damage during the mounting and fabrication of the infrared detectors.

DETAILED DESCRIPTION OF THE PREFERRED EMBODIMENT

The hybrid focal plane of the present invention is a double-sided mosaic structure. Infrared detectors are mounted on one side of a semiconductor substrate and solid state signal processing circuitry is formed in the semiconductor substrate proximate to the opposite side of the substrate. Interconnect means extend through the semiconductor substrate to connect the infrared detectors with the solid state signal processing circuitry.

Figure 1A:
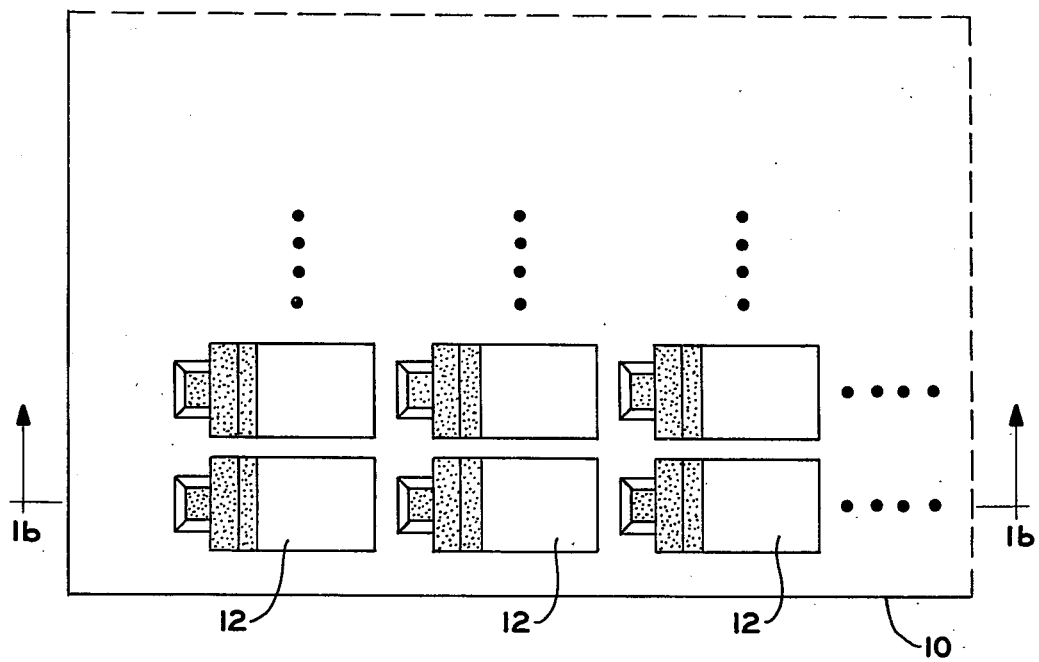
FIGS. 1a and 1b show top and cross-sectional views of the hybrid focal plane of the present invention.
Figure 1B:
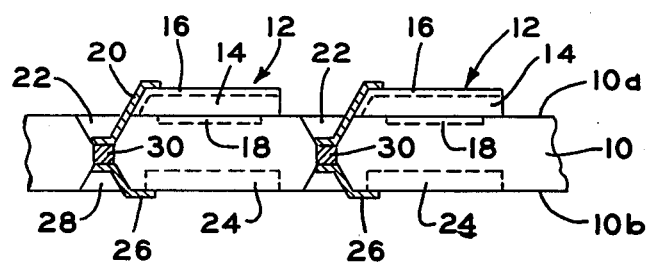

FIGS. 1a and 1b show top and cross-sectional views of a preferred embodiment of the present invention. In the embodiment shown in FIGS. 1a and 1b, the semiconductor substrate 10 is preferrably a silicon wafer having a thickness of between about 0.001 and 0.004 inches. Mounted on a first surface 10a of substrate 10 are a plurality of infrared detectors 12. In the preferred embodiment shown in FIGS. 1a and 1b, infrared detectors 12 are photovoltaic mercury cadmium telluride detectors having a p-type region 14 and an n-type region 16.

Electrical contact to p-type region 14 of detector 12 is preferably made by a back-side diffused or ion-implanted region 18 in substrate 10. Electrical contact to n-type region 16 is made by a thin-film metalization 20 which extends from region 16 into a valley or via 22 in substrate 10.

The solid state signal processing circuitry is formed in the opposite surface 10b of substrate 10. In the embodiment shown in FIGS. 1a and 1b, the source region 24 of a charge coupled device (CCD) circuitry is shown below each detector. The photo signal from each detector is supplied to its corresponding source region 24. Interconnection between infrared detector 12 and source region 24 is provided by thin film metallization 26 which extends from source region 24 into a valley 28 which is immediately opposite valley 22. The region 30 between thin film metallizations 20 and 26 is either a high-conductivity region formed by ion-implantation or diffusion or is a metallized region. The photosignal from region 16 of detector 12, therefore, is provided to source region 24 through metallization 20, region 30 and metallization 26.

In one preferred embodiment of the present invention, the backside 10b of silicon substrate 10 is processed to produce the desired CCD signal processing circuitry. Next, shallow vias or valleys 28 are etched into surface 10b and the region 30 at the bottom of the valleys 28 is ion-implanted to form region 30 of high electrical conductivity. Thin film metallization 26 from source region 24 is then deposited. Finally, the surface 10b is passivated to prevent any degradation of the signal processing circuitry during subsequent processing of the infrared detectors.

After passivation of surface 10b, substrate 10 is thinned from the top surface to a final thickness of approximately 0.001 inches to 0.004 inches. The regions of surface 10a which will eventually become backside contact areas 18 for the (Hg,Cd)Te 12 are then ion-implanted to form high electrical contact activity regions.

At this point, a (Hg,Cd)Te layer is attached to the top surface 10a of silicon substrate 10. This (Hg,Cd)Te layer may be a slab of (Hg,Cd)Te which is bonded to surface 10a, or may be a layer grown by liquid phase epitaxy, as is described in U.S. Pat. No. 3,902,924 by Maciolek et al. In either case, a (Hg,Cd)Te layer is then processed and delineated to form individual elements 12 of the mosaic array. Again, shallow vias 22 are etched into silicon substrate 10 to a depth where the ion implanted region 30 is reached. A pn junction is then formed in the (Hg,Cd)Te by ion implantation or diffusion techniques and n-type region 16 is interconnected to region 30 by thin film metallization 20. The mosaic photovoltaic detector elements 12, therefore, are interconnected to the CCD signal processing circuitry on the backside of silicon substrate 10.

The structure of the present invention provides several important advantages. First, the element packing densities attainable with this approach are very high. Element packing densities may be greater than or equal to 90%. Second, the double-sided mosaic configuration of the present invention allows processing of the infrared detectors without damaging the signal processing circuitry since the signal processing circuitry is on the opposite surface. Third, when the infrared detector material is produced by epitaxial growth techniques, a direct interface is produced between infrared detector material and the semiconductor substrate. This yields improved thermal conductivity at the interface which can be an important factor in improved reliability.

In conclusion, the double-sided mosaic hybrid focal plane of the present invention is a highly advantageous infrared detector system configuration. Although the present invention has been described with reference to preferred embodiments, workers skilled in the art will recognize that changes may be made in form and detail without departing from the spirit and scope of the invention. For example, although silicon has been described as a preferred semiconductor substrate material and mercury cadmium telluride has been described as the preferred infrared detector material, other semiconductor materials may also be used. In addition, the present invention is also applicable to photoconductive detectors, although photovoltaic detectors have been specifically described. Finally, although the interconnect configuration shown in the Figures is highly advantageous and is relatively simple to fabricate, other interconnections which extend through the semiconductor substrate to interconnect the infrared detectors with the solid state signal processing circuitry may also be used.

The embodiments of the invention in which an exclusive property or right is claimed are defined as follows:

1. A method of forming an infrared detector comprising:
   providing a semiconductor substrate having first and second surfaces, and having solid-state signal processing circuitry formed therein proximate the second surface;
   forming first valleys in the first surface and second valleys in the second surface, the first and second valleys being arranged in opposing pairs;
   ion implanting the substrate regions connecting opposing pairs of first and second valleys;
   forming contact areas on the first surface of said semiconductor substrate;
   epitaxially growing infrared detector material on the first surface of said semiconductor substrate;
   delineating said infrared detector material to form individual infrared detector elements;
   forming p-n junctions in the infrared detector elements so that a first side of each p-n junction is intimately connected to a contact area on the first surface of said semiconductor substrate;
   forming electrical connections between the second side of each p-n junction and one of said first valleys; and
   forming electrical connections between said second valleys and the solid-state signal processing circuitry.

2. The method of claim 1 wherein steps are performed in the following order:
   forming valleys in the second surface;
   ion implanting the regions at the bases of the second valleys to form regions of high conductivity;
   forming electrical connections between the valleys in the second surface and the solid-state signal processing circuitry by metallization;
   defining contact areas in the first surface;
   ion implanting the contact areas to form areas of high conductivity;
   growing infrared detector material on the first surface by epitaxy;
   delineating the detector material to form infrared detector elements;
   forming valleys in the first surface;
   forming p-n junctions in the infrared detector elements so that the p-type material is in intimate contact with the contact areas on the first surface; and
   forming electrical connections between the valleys in the first surface and the n-type material in the detector elements by metallization.

* * * * *